United States Patent [19]
Rodrigues et al.

[11] Patent Number: 5,679,586
[45] Date of Patent: Oct. 21, 1997

[54] COMPOSITE MASK PROCESS FOR SEMICONDUCTOR FABRICATION

[75] Inventors: Richard Anthony Alexis Rodrigues, Lanarkshire, England; Ewen Gillespie, Edinburgh, Scotland

[73] Assignee: Seagate Technology, Inc., Scotts Valley, Calif.

[21] Appl. No.: 138,606

[22] Filed: Oct. 14, 1993

Related U.S. Application Data

[63] Continuation of Ser. No. 740,419, Aug. 5, 1991, abandoned.

[30] Foreign Application Priority Data

Oct. 4, 1989 [GB] United Kingdom ............... 8922331
Oct. 4, 1990 [WO] WIPO ............... PCT/GB90/01528

[51] Int. Cl.$^6$ ............................................. H01L 21/265
[52] U.S. Cl. ............ 437/31; 437/74; 437/75; 437/148; 437/153; 437/979; 148/DIG. 10; 148/DIG. 163
[58] Field of Search .................. 437/31, 74, 75, 437/979, 141, 147, 148, 153; 148/DIG. 10, DIG. 11, DIG. 163; 257/544, 545, 565

[56] References Cited

U.S. PATENT DOCUMENTS

| | | | |
|---|---|---|---|
| 3,928,081 | 12/1975 | Marley, Jr. et al. | 437/31 |
| 3,928,082 | 12/1975 | Schwettmann et al. | 437/31 |
| 3,933,528 | 1/1976 | Sloan, Jr. | 148/1.5 |
| 4,018,627 | 4/1977 | Polata | 437/74 |
| 4,021,270 | 5/1977 | Hunt et al. | 148/187 |
| 4,277,291 | 7/1981 | Cerofolini | 148/187 |
| 4,280,272 | 7/1981 | Egawa et al. | 148/187 |
| 4,403,395 | 9/1983 | Curran | 437/74 |
| 4,648,909 | 3/1987 | Krishma et al. | 437/74 |
| 4,717,678 | 1/1988 | Goth | 437/31 |

FOREIGN PATENT DOCUMENTS

| | | |
|---|---|---|
| 0 169 600 | 1/1986 | European Pat. Off. . |
| 0 242 623 | 10/1987 | European Pat. Off. . |
| 0 398 032 | 11/1990 | European Pat. Off. . |
| 0 398 291 | 11/1990 | European Pat. Off. . |
| 0 072 967 | 3/1983 | Germany . |
| 0 244 607 | 11/1987 | Germany . |
| 2128401 | 4/1984 | United Kingdom . |
| 82/03945 | 11/1982 | WIPO . |

*Primary Examiner*—George Fourson
*Assistant Examiner*—Long Pham
*Attorney, Agent, or Firm*—Flehr Hohbach Test Albritton & Herbert LLP

[57] ABSTRACT

This is a method of making a semiconductor device comprising covering a first semiconductor compound having a plurality of windows on a major surface of a semiconductor body, covering a second semiconductor compound on selected windows of the first compound, forming openings in the second compound over the selected windows, forming electrodes by introducing an impurity in the semiconductor body through the openings.

19 Claims, 6 Drawing Sheets

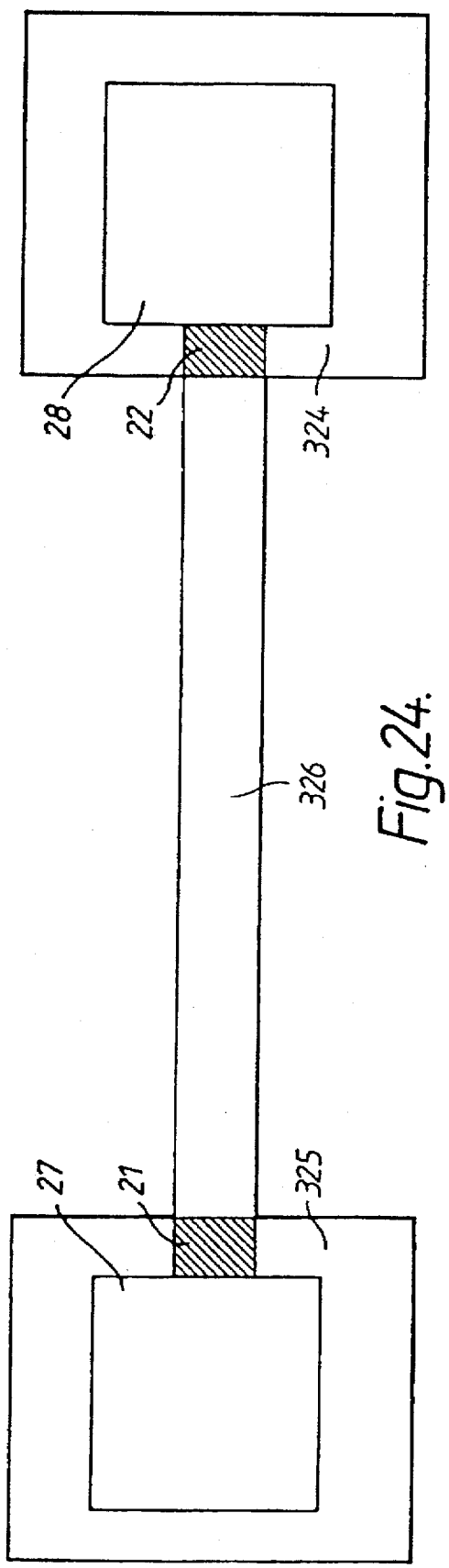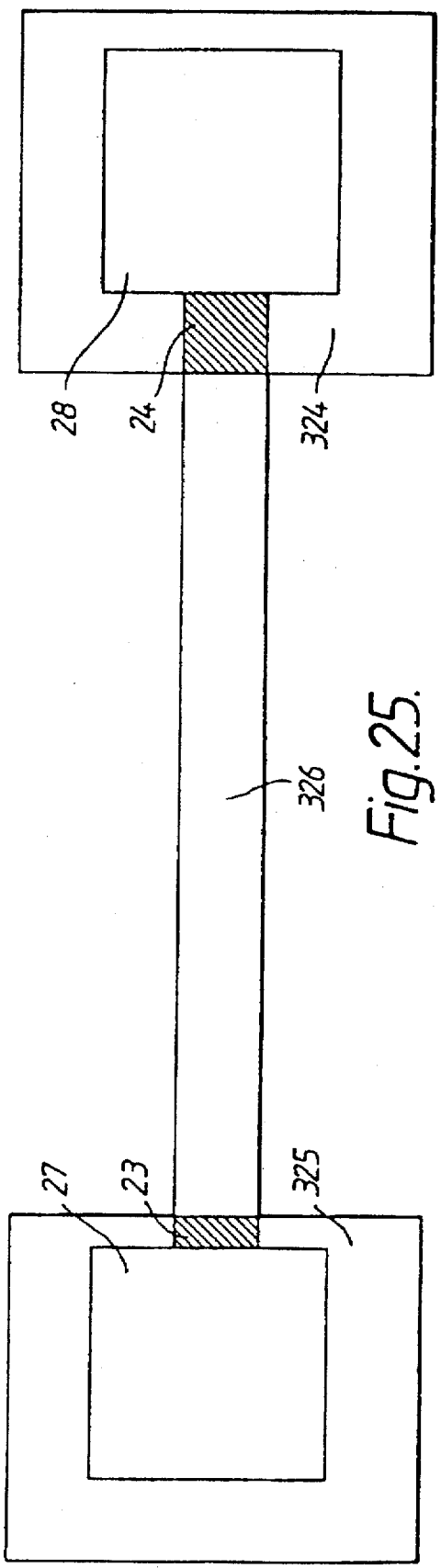

COMPOSITE MASK PROCESS FOR SEMICONDUCTOR FABRICATION

This is a continuation of application Ser. No. 07/740,419 filed Aug. 5, 1991 now abandoned.

BACKGROUND OF THE INVENTION

The present invention relates to a semiconductor device fabrication process.

In planar processes of semiconductor device fabrication, impurities required to providedoped semiconductor regions that form the electrodes of a semiconductor device are introduced into a bulk of semiconductor material through windows in a mask laid over a major surface of the bulk or semiconductor material. The impurities required for the semiconductor device electrodes are usually of more than one type and are required in differing concentrations, and it is usually necessary to carry out several diffusion or implantation operations, with the aid of masks, in the fabrication of a semiconductor device. In a diffusion operation, a mask is used to cover selected areas of a semiconductor bulk and the entire semiconductor bulk is exposed to a gas containing the appropriate impurity in a specific concentration, the result being that the impurity diffuses through windows in the mask into the semiconductor bulk and establishes a specific doping level in a region of the semiconductor bulk. In an implantation operation, a beam of ions of an impurity is directed through windows in a mask.

One significant difficulty of any planar process is that of ensuring that the device electrodes, as defined by respective masks, have the correct relative locations, the difficulty being in ensuring that, where several masking operations are carried out in sequence, each later used mask is correctly positioned relative to previously used masks. Also, the accuracy with which a mask may be positioned relative to a previously used mask dictates the minimum sizes of semiconductor device electrodes which may be fabricated in a production process.

Some of the difficulties faced in the positioning of the masks used in the planar processes may be alleviated by the use of composite masks which combine, on a single mask, the features of two or three correctly positioned separate masks, and the modification of the other process steps in order to effect the introduction of impurities through only some of the unmasked areas of the composite mask during each operation in which an impurity is introduced into a host material.

SUMMARY OF THE INVENTION

It is an object of the present invention to provide a semiconductor device fabrication process which facilitates the use of a composite mask.

In accordance with one aspect of the present invention, a semiconductor device fabrication process in which the electrodes of a semiconductor device are made by introducing impurities into a body of semiconductor material through specific areas of a major surface of the body of semiconductor material during separate stages of the fabrication process, includes the steps of:

forming a covering of a first semiconductor compound, the first covering, on a major surface of the semiconductor body, and including, in the first covering, a plurality of windows each of which defines a respective electrode of a semiconductor device, forming a covering of a second semiconductor compound, the second covering, immediately on the first covering, over selected ones of the windows and leaving open the remaining windows, which second semiconductor compound is removable without the removal of significant amounts of the first semiconductor compound, and fabricating respective electrodes of the semiconductor device, during separate stages of the fabrication process, by, at each stage, introducing an impurity into the body of semiconductor material through the open windows.

In accordance with another aspect of the present invention, a semiconductor device fabrication process in which impurities are introduced into a body of semiconductor material through specific areas of a major surface of the body of semiconductor material during separate stages of the fabrication process, includes the steps of:

forming a covering of a first semiconductor compound, the first covering, on a major surface of the semiconductor body, etching, in the first covering, windows which define areas of the surface into which impurities will be introduced into the body of semiconductor material during the fabrication process, forming a covering of a second semiconductor compound, the second covering, immediately on the first covering, over selected ones of the windows and leaving open the remaining windows, which second semiconductor compound is removable without the removal or significant amounts of the first semiconductor compound, and introducing an impurity into the body of semiconductor material through the open windows, at one stage of the fabrication process.

In accordance with a further aspect of the present invention, a semiconductor bipolar device fabrication process in which impurities are introduced into a body of semiconductor material through specific areas of a major surface of the body of semiconductor material during separate stages of the fabrication process, includes the steps of:

forming a covering of a first semiconductor compound, the first covering, on a major surface of the semiconductor body, and including, in the first covering, windows which define areas of the surface into which impurities are to be introduced into the body of semiconductor material during the fabrication proces, forming a covering of a second semiconductor compound, the second covering, immediately on the first covering, over selected ones of the windows and leaving open the remaining windows, which second semiconductor compound is removable without the removal of significant amounts of the first semiconductor compound, and introducing an impurity into the body of semiconductor material through the open windows, at one stage of the fabrication process.

The windows included in the first covering may be made by applying a mask to the first covering and etching the first covering over selected areas defined by the mask.

Preferably, the etching is performed to remove substantially all of the original covering at the windows and a thinner layer of the same material is then provided at the windows.

Preferably, forming the second covering over selected ones of the windows includes the steps of covering all the windows with the second covering and, subsequently, removing the second covering from specific windows.

Preferably, for each introduction of an impurity into the body of semiconductor material, the second covering is removed from every window through which an impurity will be introduced.

Preferably, following the introduction of an impurity through open windows, the windows are closed by a new covering, the third covering, of the material of the first covering.

Preferably, in preparation for the introduction of an impurity through the last selected windows through which an impurity is to be introduced, the remainder of the second covering is removed.

Preferably, the semiconductor device fabrication process includes the steps of removing the first covering from the last windows through which an impurity is introduced and covering the exposed semiconductor material with the same material as the first covering, the fourth covering, thin enough to permit the implantation of an impurity.

Preferably, the semiconductor device fabrication process includes the steps of implantating an impurity through the fourth covering.

Preferably, following the introduction of an impurity through the last open windows through which an impurity is to be introduced, the remainder of each covering is removed in order to provide a substantially plane surface for further processing.

A semiconductor wafer may include a plurality of partly fabricated semiconductor devices produced by a process in accordance with the invention.

A silicon semiconductor wafer may comprise a plurality of partly fabricated silicon semiconductor devices each including a major surface that is a part of the silicon semiconductor wafer, each major surface having a covering of silicon dioxide, characterised by first regions of a first thickness of silicon dioxide contiguous with second regions of a second thickness of silicon dioxide and with third regions of a third thickness of silicon dioxide, the second regions being thinner than the first regions and thicker than the third.

The process may be a bipolar process and the windows may define the electrodes of a bipolar device.

The first semiconductor compound is, preferably, silicon dioxide and the second semiconductor compound is, preferably, silicon nitride.

BRIEF DESCRIPTION OF THE DRAWINGS

Three examples of a semiconductor device fabrication process, in accordance with the present invention, will now be described by way of example only, with reference to the accompanying drawings, in which.

DESCRIPTION OF A PREFERRED EMBODIMENT

It will be understood that each partly completed device illustrated by the accompanying drawings represents one of a plurality of similar devices which are being fabricated all at the same time by the process and which belong to a semiconductor wafer.

Figure 1:
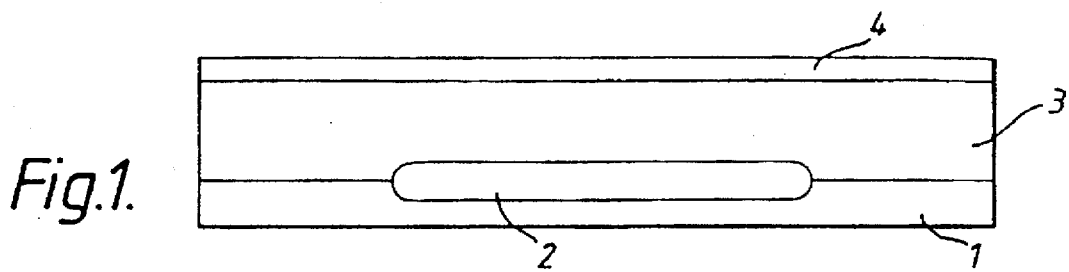
FIGS. 1 to 14 represent a first bulk of silicon semiconductor material subjected to fourteen steps of a first form of the process to yield, as illustrated by FIG. 14, an isolation region, a collector region, and a base region, for a silicon planar transistor, provided with a covering of silicon dioxide.

Referring to FIG. 1 of the accompanying drawings, material suitable as the starting point for the doping steps (the steps introducing impurities) in the manufacturing process of a planar silicon transistor consists of a P-type silicon semiconductor substrate 1 having an $N^+$-type semiconductor buried region 2, an N-type semiconductor epitaxial layer 3 in contact with the substrate 1 and the buried region 2, and a silicon dioxide layer 4 covering the surface of the epitaxial layer 3 that is remote from the substrate 1. The thickness of the silicon dioxide layer is about 1 µm. The P-type silicon semiconductor substrate 1 is, as explained above, part of a silicon wafer in which will be found a plurality of the devices produced by the fabrication process.

Figure 2:
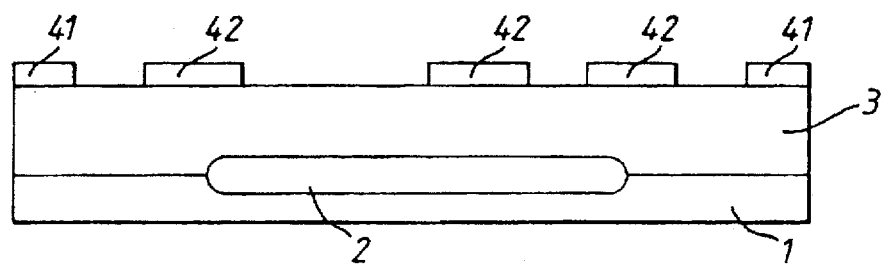

Referring to FIG. 2 of the accompanying drawings, the silicon dioxide layer 4 is masked and etched to leave some areas of the surface of the epitaxial layer 3 exposed and other areas of the surface of the epitaxial layer 3 still covered by regions 41 and 42, of silicon dioxide. The outer gap between the regions 41 and 42 may be of circular or rectangular shape. That is, there may be a circular or rectangular strip of exposed surface of the epitaxial layer 3 between the region 41 and the outer parts of the region 42. The exposed areas of the epitaxial layer 3 are windows through which impurities will be introduced into the epitaxial layer 3 at different times, but the exposed areas are all defined in one step by means of a single mask. The windows in the silicon dioxide region 42 may have peripheries that are circular, or partly circular and partly rectangular, when the peripheries of the outer gap between the regions 41 and 42 are circular. When the peripheries of the outer gap between the regions 41 and 42 are generally rectangular, the windows in the region 42 may be expected to have generally rectangular peripheries.

Referring still to FIG. 2 of the accompanying drawings, photolithographic techniques are used in the masking step, and the etching operation may be accomplished by wet or dry etching. Dry etching, that is, plasma-assisted etching, is preferred because it provides a result that is more accurate than that possible with wet etching (wet etching causes more erosion of the sides of the windows). A dry etch will, of course, attack silicon nitride as well as silicon dioxide if both are present, but in the presence of silicon dioxide alone, dry etching is possible. At the stage represented by FIG. 2, the relative positions of the windows in the silicon dioxide layer, which are intended to be identical to those present in the single mask, may be examined in order to ensure that the critical dimensions of the mask have been preserved in the transfer of the mask to the silicon dioxide layer.

Figure 3:
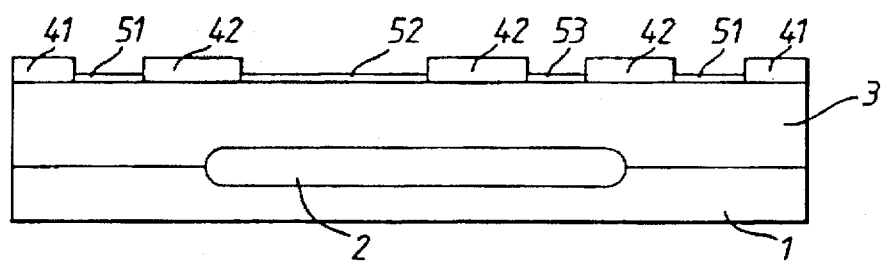

Referring now to FIG. 3 of the accompanying drawings, the exposed areas of the surface or the epitaxial layer 3 are covered by regions 51, 52 and 53 of thermally grown silicon dioxide, of thickness of about 1000 Å. The formation of the regions 51, 52 and 53 of thermally grown silicon dioxide does not alter the relative positions of the windows which are still as defined by the regions 41 and 42.

Figure 4:
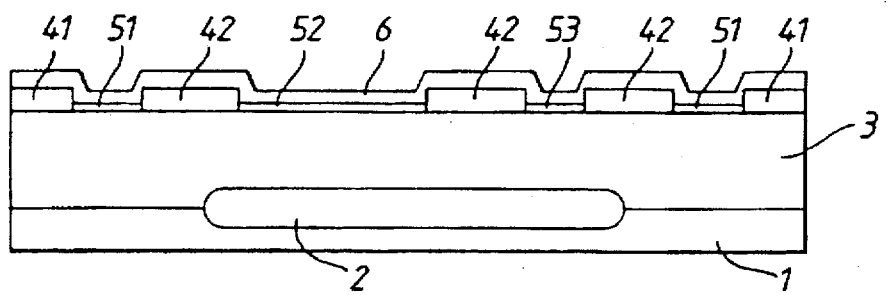

Referring now to FIG. 4 of the accompanying drawings, the silicon dioxide regions 41, 42 51, 52 and 53 are covered by a layer 6 of silicon nitride, of thickness about 2200 Å. The layer 6 of silicon nitride may be formed by a decomposition process such as that involving the decomposition of silane ($SiH_4$) and ammonia ($NH_3$) to yield silicon nitride ($Si_3N_4$) and hydrogen ($H_2$).

Figure 5:
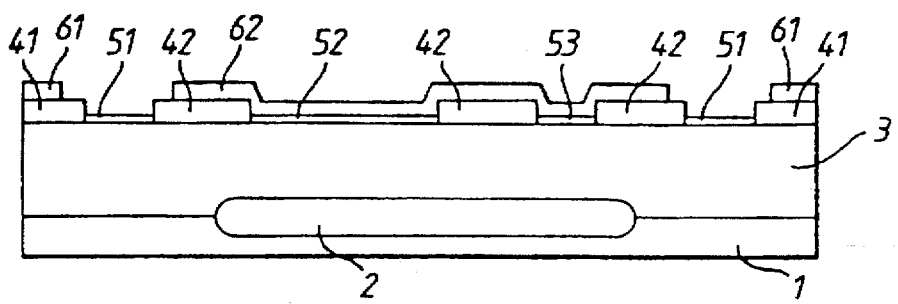

Referring now to FIG. 5 of the accompanying drawings, the silicon nitride is removed from the oxide region 51 by the use of an oversize mask that leaves regions 61 and 62 of the nitride layer. Not only may the mask used in the removal of the nitride be oversize, but it need not be aligned with high accuracy because the area into which a diffusion will be made is already defined by the oxide regions below the nitride layer. As will be evident from FIG. 5, the nitride layer is removed to beyond the edges of the oxide regions 41 and 42, and the exact amounts by which the oxide regions 41 and 42 extend beyond the nitride regions 61 and 62 are relatively unimportant. The removal of regions of the nitride layer is effected by means of an etchant capable of etching the nitride at a much higher rate than it will etch the oxide. The etch is stopped when it is estimated that the thickness of the oxide in the region 51 is about 500 Å.

Figure 6:
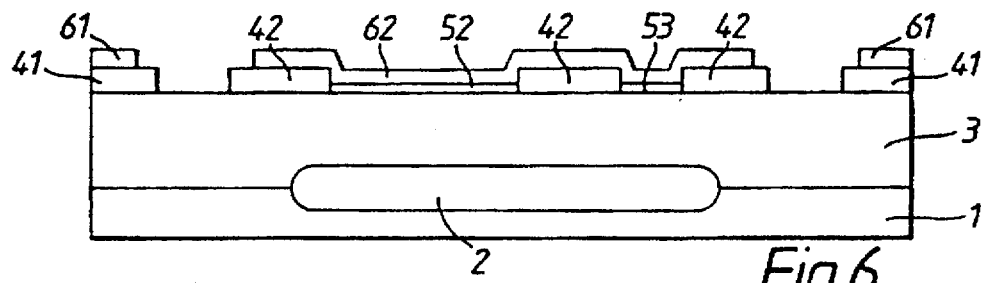

Referring now to FIG. 6 of the accompanying drawings, the oxide region 51 is removed by applying an oxide etchant which is allowed to remove all of the oxide region 51 without significantly reducing the extent of the regions 41 and 42 of oxide bounding the region 51, the regions 41 and 42 being considerably thicker than the region 51. In practice, in order to ensure the complete removal of the oxide region 51, the oxide etchant is permitted to over etch in the region 51, thus removing some of the semiconductor material in the region bounded by the oxide regions 41 and 42.

Figure 7:
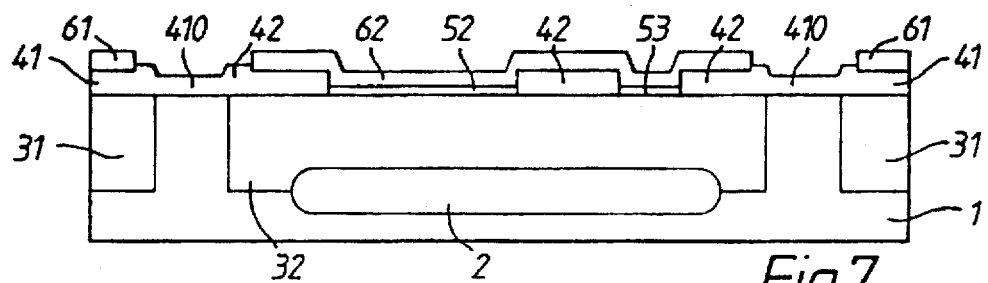

Referring now to FIG. 7 of the accompanying drawings, boron, a P-type impurity, is diffused into the exposed region bounded by the oxide regions 41 and 42 to the extent that the diffused region extends through the epitaxial layer 3 and into the substrate 1, effectively separating the epitaxial layer 3 into an outer region 31 and an inner region 32. The inner region 32 of the original epitaxial layer 3 is disc-shaped and isolated from the outer region 31 by the deep diffusion which extends like a curtain around the inner epitaxial region 32. Thus, the diffusion step illustrated by FIG. 7 achieves the isolation of the inner epitaxial region 32 from the remainder of the original epitaxial layer 3 and is completed by the growth of an oxide region 410 to shut the window between the oxide regions 41 and 42.

Figure 8:
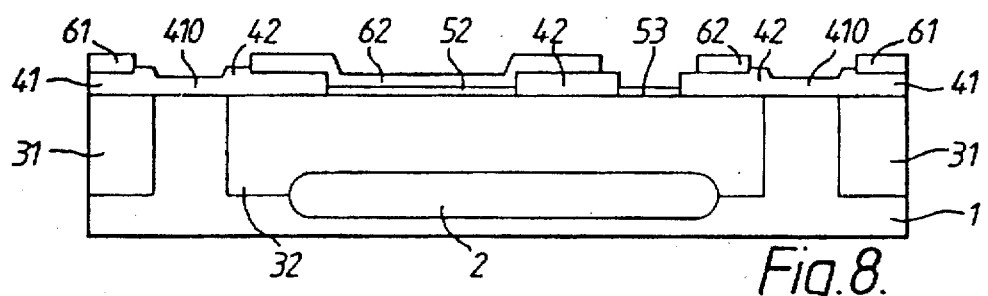

Referring now to FIG. 8 of the accompanying drawings, the next diffusion step in the process begins with the removal of the nitride region covering the oxide region 53, using, again, an over-size mask which need not be precisely aligned, in order to remove the nitride region to beyond the edges of the oxide region 53. As before, the etchant used is capable of etching the semiconductor nitride at a rate higher than that at which it etches the silicon dioxide, and, then time enough has been allowed for the removal of the nitride covering the oxide region 53, the thickness of the oxide region 53 may have been reduced to 500 Å.

Figure 9:
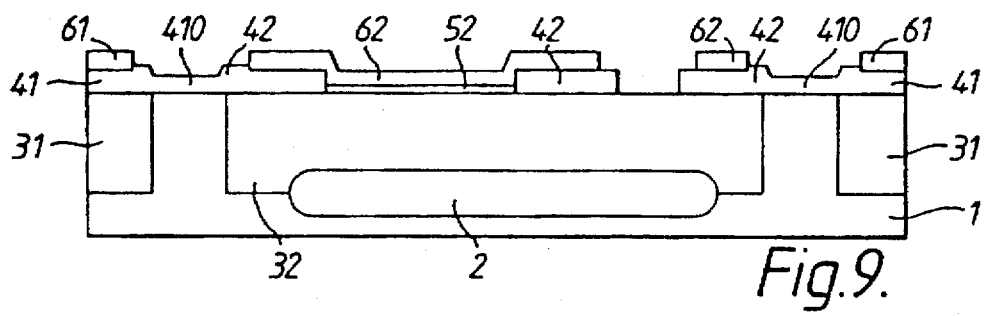

Referring now to FIG. 9 of the accompanying drawings, the inner epitaxial region 32 is prepared for a second diffusion step or the process by the etching away of the thin oxide region 53, there being, as before, a slight reduction in the thickness of the oxide region 42 bounding the region 53 due to exposure to the oxide etchant, and some attack of the surface of the inner epitaxial region 32 because of the duration of etching needed to ensure that all of the oxide region 53 is removed by the etchant.

Figure 10:
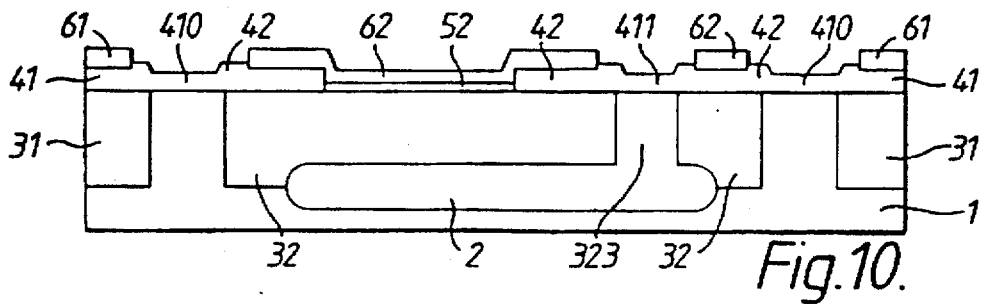

Referring now to FIG. 10 of the accompanying drawings, phosphorus, an N-type impurity is diffused into the exposed surface of the inner epitaxial region 32 in the exposed region previously covered by the oxide 53 to the extent that the $N^+$ doped material 323 extends through the inner epitaxial region 32 and into the $N^+$-type buried region 2. The diffusion step is completed by growing an oxide region 411 to shut the window in the oxide region 42.

Figure 11:
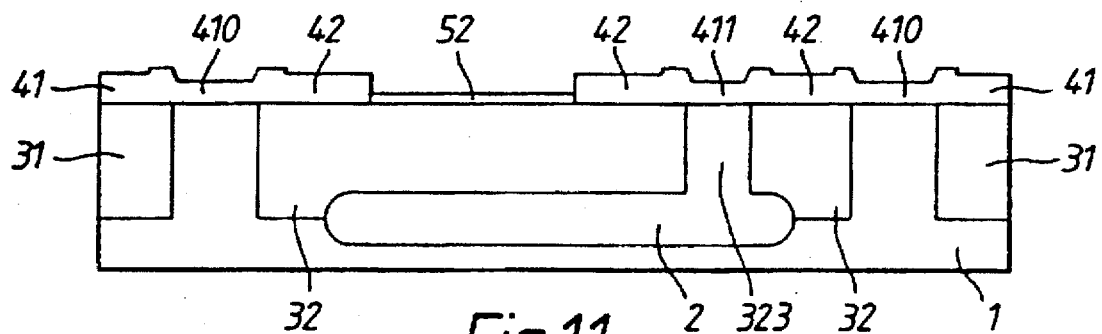

Referring to FIG. 11 of the accompanying drawings, the inner epitaxial region 32 is prepared for a third diffusion step of the process by the removal of the parts 61 and 62 of the original nitride layer 6 exposing the thin oxide region 52 which will be further reduced in thickness by the etching away of the nitride layer. The oxide region 52 is removed by a further etching step, The removal of the oxide region 52 results in some removal of the semiconductor material under the oxide region 52.

Figure 12:
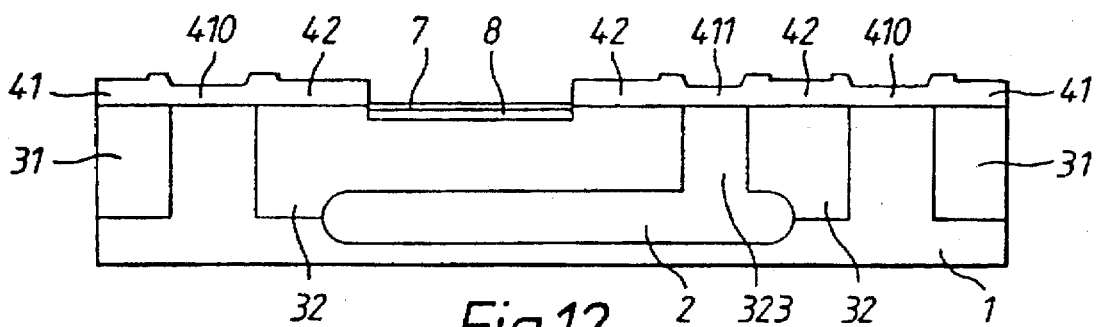

Referring to FIG. 12 of the accompanying drawings, a thin oxide layer 7 is grown over the exposed semiconductor surface and boron ions are implanted through the thin oxide layer 7 to provide a P-type region 8.

Figure 13:
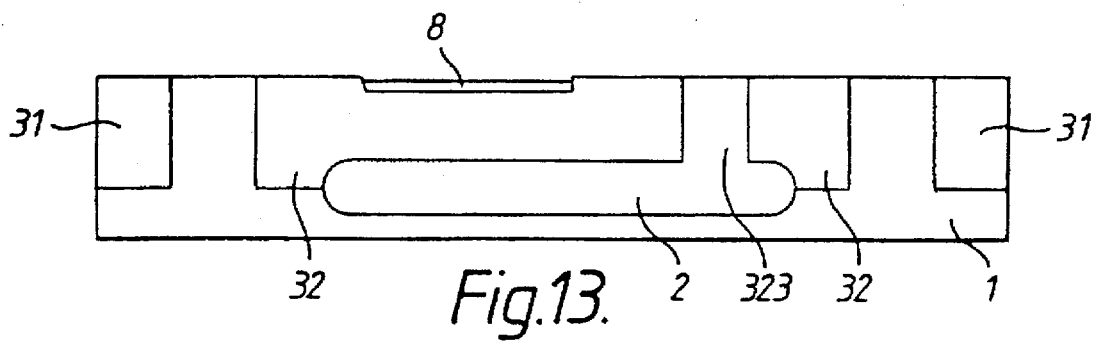
Figure 14:
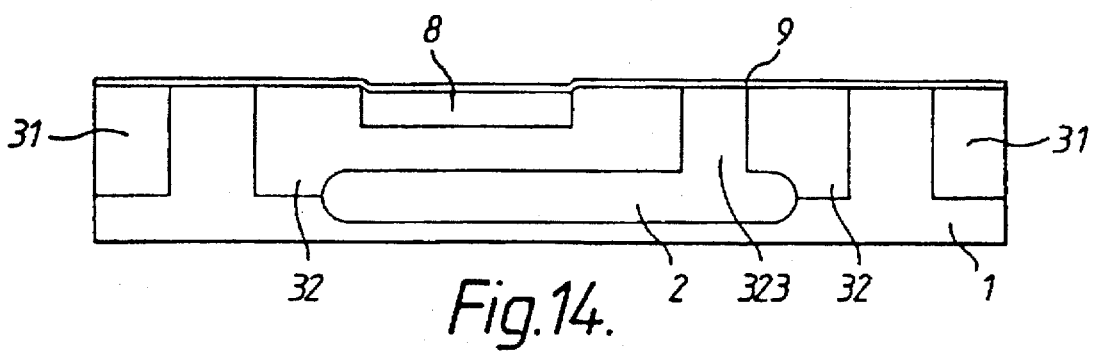

Referring now to FIG. 13 of the accompanying drawings, the process is continued by the removal of the thin oxide region 7 and the thicker oxide regions 41, 42, 410 and 411 covering the remainder of the surface, in preparation for a further step in the process, illustrated by FIG. 14.

Referring to FIG. 14 of the accompanying drawings, the next step in the process requires the heating of the structure to cause the diffusion of the region 8 into the inner epitaxial region 32, and to grow a new layer 9 of oxide over the entire surface of the structure.

The process illustrated by FIGS. 1 to 14 is completed by the opening of a window in the oxide layer 9 covering tho P-type region 8, the introduction, preferably by diffusion, of an N-type region into the region 8, the opening of windows in the oxide layer 9 covering the regions 8 and 323, respectively, and the provision of metal regions contacting the regions 8, 323, and the additional region introduced into the region 8. The device produced on the completion of the process is an NPN planar transistor in which the region 32 is the N-type collector electrode, the region 8 is the P-type base electrode, and the additional R-type region diffused into the region 8 is the emitter electrode. These completion steps, forming no part of the invention, are not illustrated or described in detail.

FIGS. 15 to 18 illustrate alternative steps to those illustrated by FIGS. 11 to 14 in arriving at the result represented by FIG. 14 from the position represented by FIG. 10.

Figure 15:
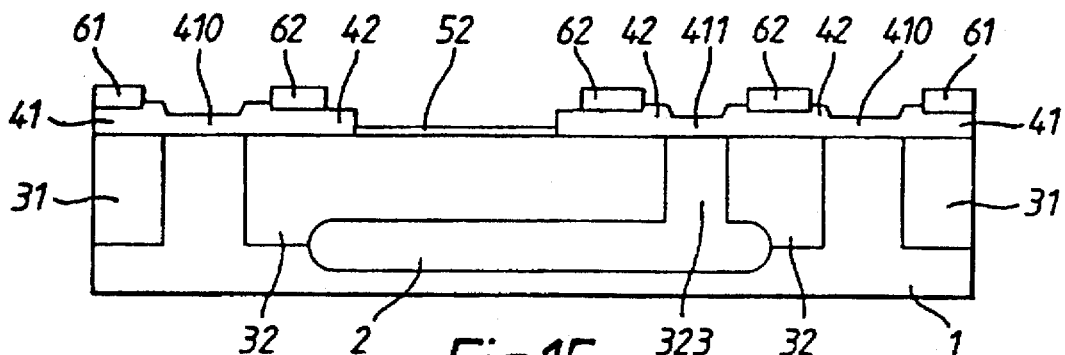
FIGS. 15 to 18 represent a second bulk of silicon semiconductor material subjected to the same initial process steps as those illustrated by FIGS. 1 to 10 and, thereafter, to alternative steps to those of FIGS. 11 to 14, but providing a result, illustrated by FIG. 18, which is the same as that illustrated by FIG. 14, FIGS. 19 to 23 represent a third bulk of silicon semiconductor material subjected to similar process steps to those illustrated by FIG. 1 to 7 (but with a different pattern of windows for the introduction of impurities) to yield, as illustrated by FIG. 19, an isolation region and a base region, and, thereafter, to steps necessary to provide a resistor, as illustrated by FIG. 23, and, FIGS. 24 and 25 represent in plan view the resistor shown in FIG. 23 in relation to two possible positions of its contact pads which will be provided, at a later stage, by steps requiring the use of another mask.

Referring now to FIG. 15 of the accompanying drawings, the process steps illustrated by FIGS. 1 to 10 are followed by the removal of the nitride covering the oxide region 52 without stripping off any of the nitride elsewhere. The nitride covering the oxide region 52 is removed by the use of an over-size mask leaving the edges of the thicker surrounding oxide region 42 exposed.

Figure 16:
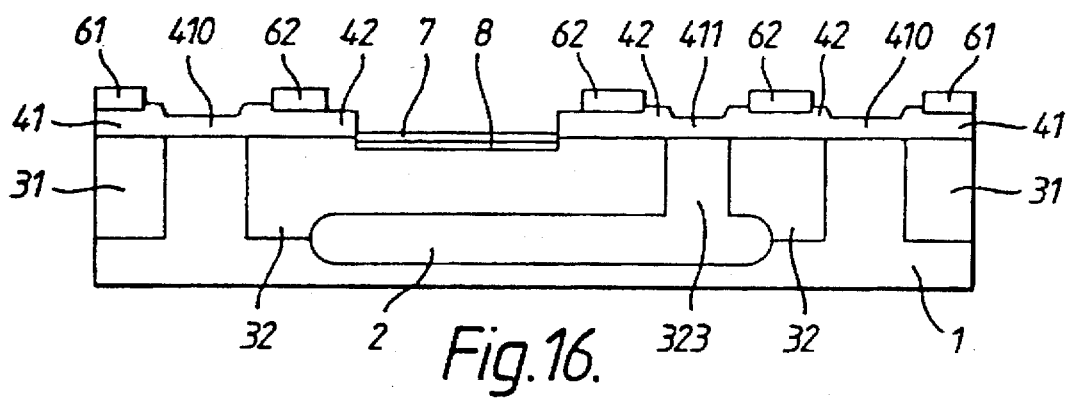

Referring to FIG. 16 of the accompanying drawings, the oxide region 52 is removed and replaced by a thinner oxide region 7, in steps which effect some cutting down of the semiconductor surface originally covered by the oxide region 52, the implantation of an N-type impurity, such as boron, into the epitaxial region 32 to provide the implanted region 8.

Figure 17:
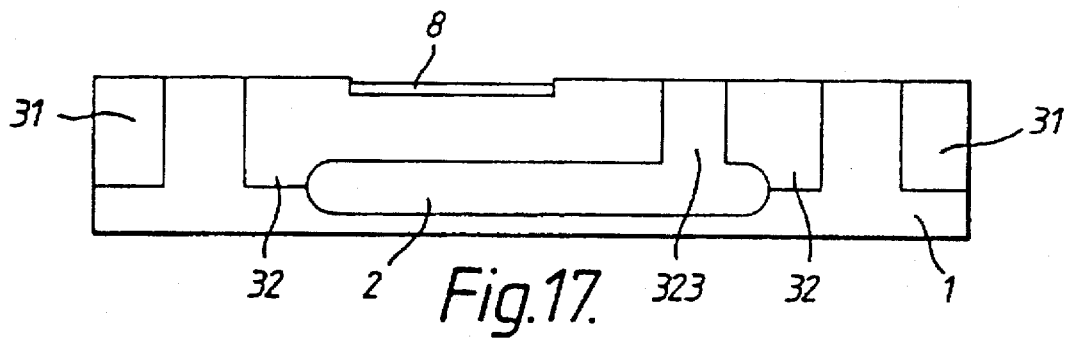
Figure 18:
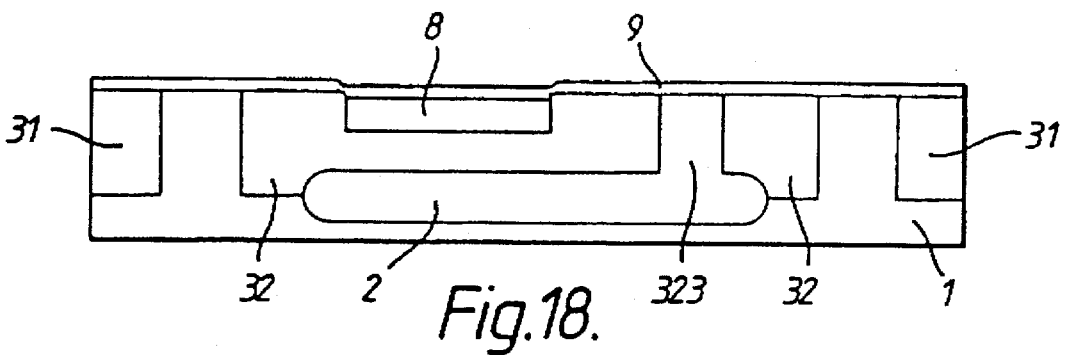

Referring to FIGS. 17 and 18, it will be apparent that the further processing steps provide the same results as are illustrated by FIGS. 13 and 14, respectively.

FIGS. 19 to 23 illustrate the later stages, beginning with that illustrated by FIG. 1, in the fabrication of a semiconductor resistor in a planar structures.

Figure 19:
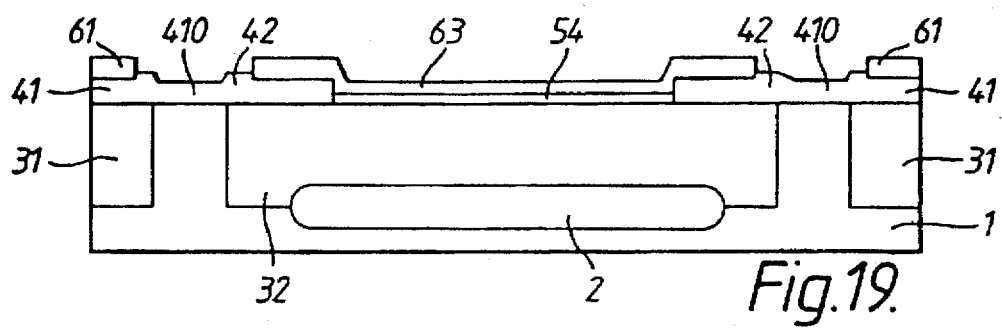

Referring to FIG. 19 of the accompanying drawings, a deep isolation diffusion, along the lines described above with reference to FIG. 7, has been completed to effect isolation of the region 32 of the epitaxial layer and the diffusion area has been covered by a silicon dioxide region 410.

Figure 20:
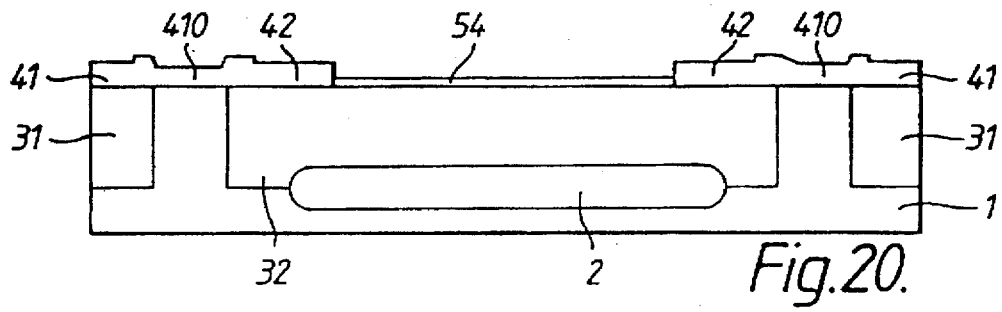

Referring to FIG. 20 of the accompanying drawings, the nitride covering 63 is then removed to expose the thin covering 54 of silicon dioxide the area of which is defined by the thicker silicon dioxide region 42.

Figure 21:
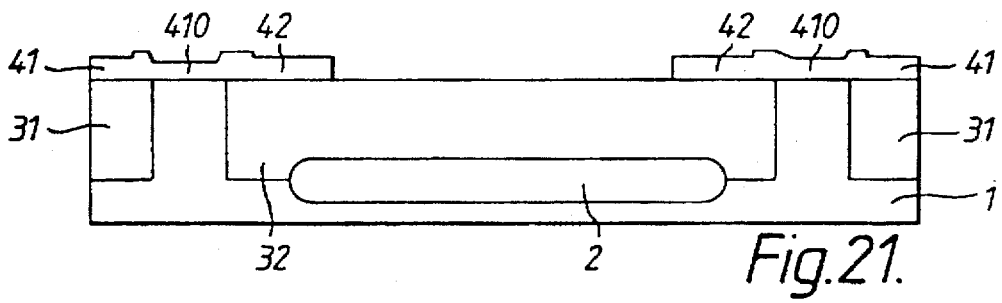

Referring now to FIG. 21 of the accompanying drawings, the thinner silicon dioxide covering 54 is removed, by means of an etchant, to expose the silicon material surface.

Figure 22:
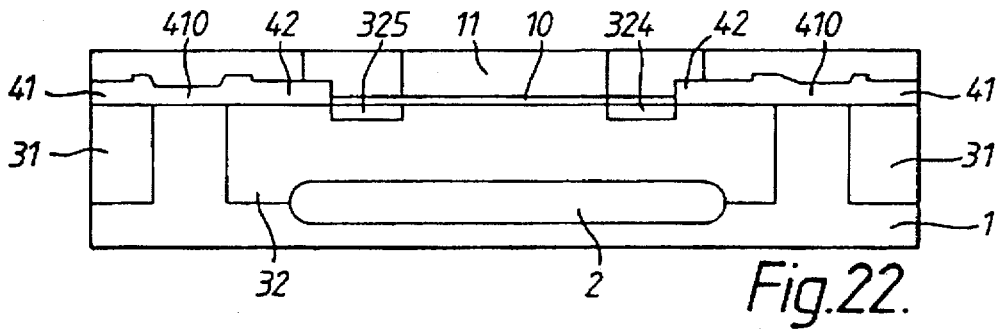
Figure 23:
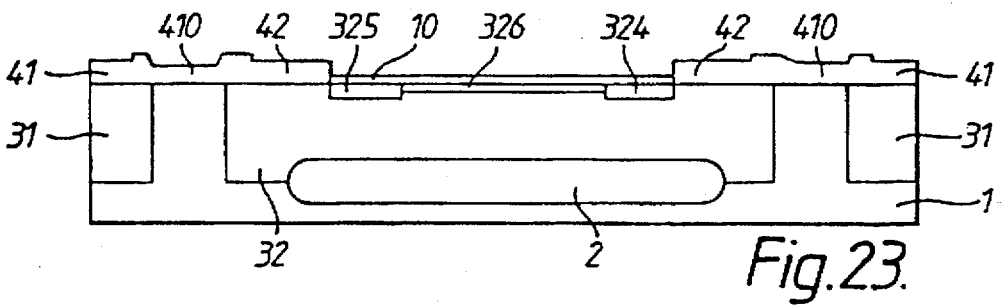

Referring now to FIG. 22 of the accompanying drawings, a thin replacement covering 10 of silicon dioxide is grown on the exposed silicon material surface and a photo-resist pattern is applied to provide a photo-resist covering 11 which has apertures defining two regions with rectangular peripheries, in the epitaxial layer 32. A impurity is implanted using the photo-resist covering and the silicon dioxide covering as a mask to provide doped regions 324 and 325. Referring now to FIG. 23, the photo-resist covering is removed and an impurity implanted through the silicon dioxide covering 10 to provide a semiconductor resistor body 326 connected to the implanted regions 324 and 325, which serve as the resistor terminals.

As before, following the stage illustrated by FIG. 23, the remainder 41, 42, 410, and 10 of the original silicon dioxide covering is removed and replaced by a fresh covering of silicon dioxide, in order to provide a generally plane surface for subsequent processing steps.

FIGS. 24 and 25 show, in plan, the body 326 of the resistor, shown in FIG. 23, and the implanted regions 324 and 325 which are the semiconductor end contact regions for the resistor which has, provided at a later stage in the process, contact pads 27 and 28 for facilitating external connections to the resistor body 326.

Referring to FIG. 24, the contact pads 27 and 28, being smaller than the end contact regions 324 and 325, may be so positioned as to add the lengths of the shaded areas 21 and 22 to the length of the body 326 of the resistor. Therefore, the value of the semiconductor resistor will be substantially the resistance of the body 326, but that value will be increased very slightly by the resistance of the total length of the shaded areas 22 and 23 in line with the length of the body 326 of the resistor.

Referring to FIG. 25, the contact pads 27 and 28 may be positioned slightly differently on the contact regions 324 and 325, but it will be evident that the total length of the shaded regions, shown in FIG. 25, will be the same as the total length of the shaded regions 21 and 22, shown in FIG. 24, and that, therefore, the resistor provided by the arrangement represented by FIG. 24 will have the same value as the resistor provided by the arrangement represented by FIG. 25. That is, the alignment of the mask for defining the area covered by the contact pads 27 and 28 need not be performed with great precision, the only practical restriction being that no pad 27 or 28 should extend outside the regions 324 and 325. The total length of the shaded areas 27 and 28 along the line of the body 326 of the resistor is set by the spacing of the windows for the contact pads 27 and 28 on the mask containing those windows.

The semiconductor device fabrication process steps described with reference to FIGS. 1 to 23 of the accompanying drawings represent major steps in a planar semiconductor device fabrication process and will, therefore, yield substantially complete planar transistors, say, requiring only a conventional emitter diffusion, final passivation and metallisation for the completion of the planar transistors in a complete wafer. It will be understood, therefore, that wafers comprising almost complete devices may be produced at one location, by the fabrication process steps described herein, and moved to another location for completion.

The main features of the process described with reference to the accompanying drawings are as follows:

1. The process is able to utilise a three-layer composite mask providing, for a planar transistor, a base region, a deep $N^+$ connection to a buried collector layer, and isolating barrier.

2. A four-layer composite mask may be used, where the fourth layer is for an implanted resistor.

3. in the application of the process to a silicon wafer, dry (plasma-assisted) etching may be used because the etching of the masking silicon dioxide covering is carried out before any deposition of silicon nitride is carried out. Additionally, the quality of the features transferred from the composite mask to the silicon dioxide covering may be inspected before proceeding further. Dry etching is a more precise process than wet etching, and wet etching must be used if silicon nitride is present.

4. The composite mask does not include any registration tolerances (it does not require any registration tolerances), and, as a result, there is no semiconductor material wasted in providing registration tolerances.

5. Any defects in the first covering, that is, the silicon dioxide covering, when a silicon semiconductor wafer is used, such as pinholes or scratches, will generally be covered by the second covering during the process, and will not cause defects. Also, defects in the second covering will not lead to exposure of the semiconductor material because of the presence of the first covering.

6. As the first covering may be inspected after the etching step transferring the features of the three or four-layer composite mask, all dimensions, including critical dimensions, are available for inspection. That would not be the case if etching of the first covering were conducted with the second covering in place.

7. The practice of removing all of the remaining first and second coverings before proceeding, in a planar transistor, to beyond the implantation of the base, means that any finalmetallisation layer will encounter no step higher than the thickness of a single covering of semiconductor compound along the surface of the finished device.

8. All dimensions are set by the mask used define the windows in the first covering. The masks used in making openings in the second covering need not be manufactured or positioned with great accuracy, because their function is, in effect, the selection of windows already defined by the mask used for the windows in first covering.

We claim:

1. A process for fabricating on a substrate material at least one semiconductor device having electrodes and/or isolation regions or contact regions formed by introducing impurities through specific window regions of said substrate material during separate fabrication process stages, the process including the following steps:

(a) forming a first layer of silicon dioxide having a first thickness on an upper surface of said semiconductor substrate material, and defining in said layer of silicon dioxide a plurality of window regions exposing window portions of said upper surface, wherein each of said window regions correspond to a respective electrode of said semiconductor device;

(b) forming on said exposed window portions of said upper surface a thin layer of silicon dioxide having a second thickness substantially thinner than said first thickness;

(c) forming a layer of silicon nitride overlying said first layer of silicon dioxide and said thin layer of silicon dioxide and defining in said layer of silicon nitride openings exposing selected ones of said window regions, said layer of silicon nitride overlying and covering remaining unselected ones of said window regions;

(d) removing said thin layer of silicon dioxide to expose said window portion for at least one of said selected ones of said window regions; and (e) during at least one separate fabrication process stage, introducing by diffusion a first impurity through at least a selected one of said window portions exposed in step (d) to form a first isolation region of said semiconductor device;

wherein selected openings of said window regions defined in said layer of silicon nitride at step (c) determine window portions through which impurity is diffused in step (e).

2. The method of claim 1, including the additional step:

(f) after formation of said first isolation region growing a second silicon dioxide to cover said selected one of said window portions through which said first impurity is introduced in step (e);

wherein said second silicon dioxide so grown contacts lateral portions of said first layer of silicon dioxide formed at step (a).

3. The method of claim 2, including the additional step of:

(g) removing a region of said layer of silicon nitride at least overlying unselected ones of said window region in step (c), wherein a portion of said thin layer of silicon dioxide underlying said unselected window region in step (c) is exposed;

(h) removing said thin layer of silicon dioxide exposed in step (g); and (i) during at least one separate fabrication process stage, introducing by diffusion a second impurity through said unselected window region in step (c) to form a collector contact region or plug region.

4. The method of claim 3, wherein step (g) includes using an oversize mask defining at least one opening, said opening being as large as said unselected window region in step (c).

5. The method of claim 1, wherein step (a) includes using a single mask and etching to define said plurality of window regions in said first layer of silicon dioxide.

6. The method of claim 1, wherein said first thickness exceeds said second thickness by a factor of about ten.

7. The method of claim 1, wherein step (c) includes forming said layer of silicon nitride to cover said plurality of window regions defined in step (a), and then removing regions of said layer of silicon nitride overlying said selected one of said window regions.

8. The method of claim 1, wherein step (d) includes using an oversize mask defining at least one window opening, said window opening being at least as large as said window regions in said thin layer of silicon dioxide.

9. The method of claim 1, wherein for each introduction of said first impurity through said exposed window portion, an overlying portion of said layer of silicon nitride is removed.

10. The method of claim 1, wherein following each introduction of said first impurity, said exposed window portion through which said first impurity is introduced is covered with a second silicon dioxide.

11. The method of claim 3, wherein said semiconductor device is a bipolar transistor, said first isolation region defines at least a portion of an isolating barrier surrounding a periphery of said bipolar transistor, and wherein said collector contact region or said plug region includes a collector region of said bipolar transistor.

12. The method of claim 3, further including the steps of:

(j) after formation of said first isolation region, growing a second silicon dioxide to cover said selected one of said window portions through which said first impurity is introduced in step (i), wherein said second silicon dioxide so grown contacts lateral portions of said first layer of silicon dioxide formed at step (a);

(k) removing a region of said layer of silicon nitride at least overlying unselected one of said window region that was unselected in step (c) or in step (g), wherein a portion of said thin layer of silicon dioxide underlying unselected one of said window region is exposed;

(l) removing said thin layer of silicon dioxide exposed in step (k); and (m) during at least one separate fabrication process stage, introducing by diffusion a third impurity through said unselected window region in step (c) or in step (g) to form a third region of said semiconductor device.

13. The method of claim 1, wherein after removing said thin layer of silicon dioxide, step (d) further includes forming a new thin layer of silicon dioxide having a third thickness thinner than said second thickness, and wherein diffusion in step (e) occurs through said third thickness of said new thin layer of silicon dioxide.

14. A process for fabricating, on a substrate of first conductivity-type material that includes a buried layer of second conductivity-type material covered by an epitaxial layer of second conductivity-type material, at least one bipolar transistor having regions of said second conductivity formed by introducing impurities through specific window regions of said substrate material during separate fabrication process stages, the process including the following steps:

(a) forming a first layer of silicon dioxide having a first thickness on an upper surface of said semiconductor substrate material, and defining in said layer of silicon dioxide at least first, second, and third window regions exposing first, second and third window portions of said upper surface, said first and second window regions overlying an intended isolation region, and said third window region overlying an intended collector contact region;

(b) forming on said exposed first, second and third window portions of said upper surface a thin layer of silicon dioxide having a second thickness substantially thinner than said first thickness;

(c) using a single mask, forming a layer of silicon nitride overlying said first layer of silicon dioxide and said thin layer of silicon dioxide, and defining in said layer of silicon nitride openings exposing at least said first and second window regions, said layer of silicon nitride overlying and covering remaining unselected of said unselected window regions;

(d) removing said thin layer of silicon dioxide to expose said window portions for at least said first and second window regions;

(e) during at least one separate fabrication process stage, introducing by diffusion a first conductivity-type impurity through at least said first and second window portions exposed in step (d) to form an isolation region for said bipolar device;

wherein openings defined in said layer of silicon nitride at step (c) determine window portions through which impurity is diffused in step (e);

(f) after formation of said isolation region, growing a second silicon dioxide to cover said first and second window portions through which said impurity is introduced in step (e);

wherein said second silicon dioxide so grown contacts lateral portions of said first layer of silicon dioxide formed at step (a);

(g) removing a region of said layer of silicon nitride at least overlying said third window region, said third window region being unselected in step (c), wherein a portion of said thin layer of silicon dioxide underlying said third window region is exposed;

(h) removing said thin layer of silicon dioxide exposed in step (g); and (i) during at least one separate fabrication process stage, introducing by diffusion a second conductivity-type impurity through said third window region to form a collector contact region of a collection region for said bipolar transistor.

15. The method of claim 14, wherein at least one of step (c), step (d), and step (g) include using an oversize mask defining at least one opening that is sized larger than a said window region underlying said opening.

16. The method of claim 14, wherein step (c) includes forming said layer of silicon nitride to cover said first, second and third window regions defined in step (a), and then removing regions of said layer of silicon nitride overlying said first and second window regions.

17. The method of claim 14, wherein for each introduction of said first and second conductivity type impurities through said exposed said window portion, an overlying portion of said layer of silicon nitride is removed.

18. The method of claim 14, wherein following each introduction of said first and second conductivity type impurities, said exposed window portion through which said first and second conductivity type impurities are introduced is covered with a second silicon dioxide.

19. The method of claim 14, wherein step (a) includes further defining a fourth window region overlying an intended base region of said bipolar transistor, and further including the steps of:

(j) after formation of said collector contact region, growing a third silicon dioxide to cover said third window portion through which said second conductivity type impurity is introduced in step (i), wherein said third silicon dioxide so grown contacts lateral portions of said first layer of silicon dioxide formed at step (a);

(k) removing a region of said layer of silicon nitride at least overlying said fourth window region, wherein a portion of said thin layer of silicon dioxide underlying said fourth window region is exposed;

(l) removing said thin layer of silicon dioxide exposed in step (k); and (m) during at least one separate fabrication process stage, introducing by diffusion a first conductivity-type impurity through said fourth window region to form a base electrode region of said bipolar transistor.

* * * * *